310-335 SR
10/20/81 OR 4,296,349

United States Patent [19]

Nakanishi et al.

[11] 4,296,349

[45] Oct. 20, 1981

[54] ULTRASONIC TRANSDUCER

[75] Inventors: Toshiharu Nakanishi, Kamakura; Miyo Suzuki, Fujisawa; Hiroji Ohigashi, Zushi, all of Japan

[73] Assignee: Toray Industries, Inc., Japan

[21] Appl. No.: 120,782

[22] Filed: Feb. 12, 1980

[30] Foreign Application Priority Data

Feb. 13, 1979 [JP] Japan ................................ 54-15177

[51] Int. Cl.[3] ............................................ H01L 41/08

[52] U.S. Cl. ................................... 310/335; 310/326; 310/327; 310/800; 310/334

[58] Field of Search ............... 310/334, 335, 326, 327, 310/336, 337, 800; 73/632, 644, 642; 367/150–152

[56] References Cited

U.S. PATENT DOCUMENTS

| | | | |
|---|---|---|---|
| 2,875,354 | 2/1959 | Harris | 310/336 X |
| 3,365,593 | 1/1968 | Roof et al. | 310/319 |
| 3,798,473 | 3/1974 | Murayama et al. | 310/800 X |
| 3,801,839 | 4/1974 | Yo | 310/326 X |
| 3,969,927 | 7/1976 | Yoshida et al. | 310/327 X |
| 4,184,094 | 1/1980 | Kopel | 310/327 X |

*Primary Examiner*—Mark O. Budd

[57] ABSTRACT

Ultrasonic transducer advantageously usable for diagnostic purpose includes a piezoelectric element such as a PVDF film backed with a reflective layer of a reduced thickness specified in relation to the wavelength of sound waves within the reflective layer at one-half of the free resonant frequency of the piezoelectric element. Remarkable reduction in thickness assures high transfer efficiency, broad available frequency-band and easy application of fine treatments such as etching.

11 Claims, 7 Drawing Figures

ULTRASONIC TRANSDUCER

BACKGROUND OF THE INVENTION

The present invention relates to an improved ultrasonic transducer, and more particularly relates to improvement in an ultrasonic transducer incorporating polymer piezoelectrics, which is well suited for ultrasonic diagnostics and other nondestructive evaluations.

In recent years, increasing attention has been paid to piezoelectric polymers such as polyvinylidene fluoride (PVDF) and copolymers of vinylidene fluoride with other components, because they have very remarkable properties different from those of conventional piezoelectrics materials such as PZT or $B_aT_iO_3$. For example, polymer piezoelectrics have low acoustic impedance close to that of water, plastics, or human bodies, and furthermore, they are flexible, and resistive to mechanical shock. These piezoelectric polymers have relatively strong electromechanical coupling factor $k_{33}^t$ for thickness extensional mode. Thus, the piezoelectric polymer films can be easily shaped into any desired form, and are very suitable for the transducers for ultrasonic diagnostics or non-destructive evaluations.

Various types of ultrasonic transducers have been proposed, which incorporate polymeric piezoelectrics.

In one simple example of such transducers, a polymer piezoelectric film is sandwiched by a pair of thin electrodes, and is bonded to a suitable holder substrate. By applying electric signals to the electrodes, the transducer radiates ultrasonic waves. The transducer is further able to receive external ultrasonic waves as corresponding electric signals. The transducer of this type, however, is inevitably accompanied by undesirable backward leakage of ultrasonic waves. In order to avoid this disadvantage, various constructions have been devised, which naturally results in undesirable rise in production cost.

In order to avoid this leakage trouble, another example of the conventional transducer includes a reflective layer known as a quarter wave reflector, which is made of high acoustic impedance materials, such as copper, other metals or ceramics. The said layer is interposed between the piezoelectric element and the holder substrate. This well blocks leakage of ultrasonic waves via the holder substrate. However, as described later in more detail, the relatively large thickness of above mentioned reflective layer seriously spoils the very advantage of the polymer piezoelectrics, i.e. high flexibility and excellent easiness in processing. In particular, the increased thickness of the reflective layer disables easy application of etching technique and other fine mechanical treatments to the reflective layer, which is needed in production of, for example, phased-array, linear array, or multi-element transducers.

SUMMARY OF THE INVENTION

It is one object of the present invention to provide an ultrasonic transducer of high conversion efficiency.

It is another object of the present invention to provide an ultrasonic transducer with a broad frequency-band characteristic.

It is another object of the present invention to provide an ultrasonic transducer which allows easy application of etching technique and other fine mechanical treatments to its reflective layer.

It is a further object of the present invention to provide an ultrasonic transducer retaining the very advantage of the high polymer piezoelectrics.

In accordance with the basic aspect of the present invention, a piezoelectric element is backed with a reflective layer, and the thickness of the reflective layer is an a range from 1/32λ to 3/16λ in which λ refers to the wavelength of sound waves within the relfective layer at one half of the free resonant frequency of the piezoelectric element.

DESCRIPTION OF THE PREFERRED EMBODIMENTS

Figure 1:
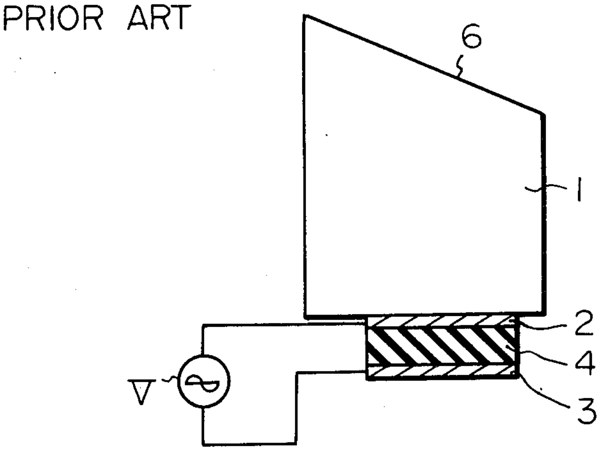
Fig. 1 PRIOR ART
FIG. 1 is a side view, partly in section, of one example of the conventional ultrasonic transducers.

The above-described one example of the conventional ultrasonic transducer is shown in FIG. 1, in which a piezoelectric polymer film 4 is sandwiched by a pair of thin electrodes 2 and 3 and the electrode 2 is bonded to a holder substrate 1. The holder substrate 1 is provided with a chamfered top 6 so that ultrasonic waves leaking through the holder substrate 1 do not return to the piezoelectric film 4 to generate undesirable noises.

Figure 2:
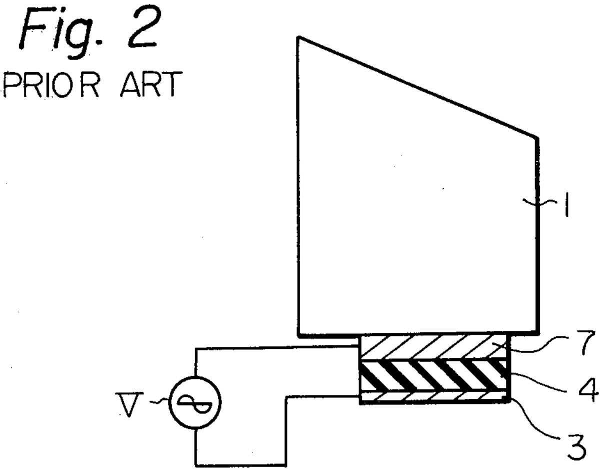
Fig. 2 PRIOR ART
FIG. 2 is a side view, partly in section, of another example of the conventional ultrasonic transducers.

As a substitute for this ultrasonic transducer with considerable leakage of ultrasonic waves, the above-described other example of the conventional ultrasonic transducer is shown in FIG. 2. In this case, the piezoelectric polymer film 4 is sandwiched by an electrode 3 and a reflective layer 7 bonded to the holder substrate 1. The reflective layer 7 is made of metal such as copper or gold and functions as an electrode also. In this case, the thickness "t" of the reflective layer 7 is usually set to a quarter of the wavelength "λ" of the ultrasonic wave within the reflective layer 7 at a half of the free resonant frequency of the piezoelectric film 4. This setting of the thickness is selected according to the following reasoning;

In the ultrasonic transducer of this type, the acoustic impedance of the backward side of the piezoelectric film is given by the following equation.

$$Z_b = Z_{io} \cdot S \cdot \frac{P_b + j\tan\pi\Omega}{1 + jP_b\tan\pi\Omega} \quad (1)$$

where $$\Omega = f_o/f \quad (2)$$

$$f = v/2_t \quad (3)$$

$$P_b = Z_{ao}/Z_{io} \quad (4)$$

$f_o$=A half of the free resonant frequency of the piezoelectric film used.

f=The free resonant frequency of the reflective layer used.

v=The sound velocity in the reflective layer used.

t=The thickness of the reflective layer used.

$Z_{ao}$=The acoustic impedance of the holder substrate per unit area.

$Z_{io}$=The acoustic impedance of the reflective layer per unit area.

S=The effective area of the ultrasonic transducer.

Assuming that PMMA is used for the holder substrate, copper is used for the reflective layer, the thickness of the copper reflective layer is chosen so that $\Omega$ is equal to $\frac{1}{2}$, and S is equal to 1 $cm^2$, the value of $Z_{ao}$ is equal to $3.22\times10^2$ kg/cm·sec, the value of $Z_{io}$ is equal to $44.7\times10^2$ kg/$cm^2$·sec, and, consequently, the value of $Z_b$ is equal to $620\times10^2$·kg/$cm^2$·sec. This value of the acoustic impedance $Z_b$ in question is roughly 200 times larger than that ($Z_{ao}$) of the PMMA holder substrate without the Cu reflective layer.

In connection with this, it is a sort of common sense in this field to choose the thickness "t" of the reflective layer so that $\Omega$ is equal to $\frac{1}{2}$. In this case, the thickness the reflective layer is set to $\frac{1}{4}$ (2n+1) times of the wavelength "λ" of the ultrasonic waves within the reflective layer at a half of the free resonant frequency the piezoelectric film, "n" being a positive integer.

This specified thickness of the reflective layer increases the backward acoustic impedance, thereby minimizing leakage of ultrasonic waves via the holder substrate. However, the relatively large thickness of the reflective layer spoils the advantage of the piezoelectric film, i.e. high flexibility and excellent easiness in processing. Further, for example in a phase array transducer, in the case when the reflective layer is used as an electrode also, the reflective layer has to be subjected to etching and other fine mechanical treatments. The large thickness of the reflective layer seriously hampers smooth practice of such treatments. Thus, the increased thickness of the reflective layer is quite undesirable for production of a transducer made up of a number of ultrasonic transducer elements.

Figure 3:
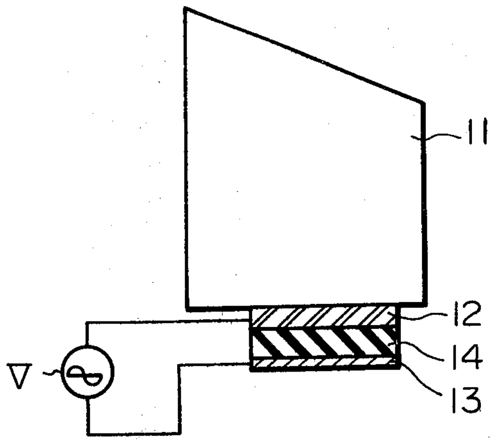
FIG. 3 is a side view, partly in section, of one embodiment of the ultrasonic transducer in accordance with the present invention.

One embodiment of the ultrasonic transducer in accordance with the present invention is shown in FIG. 3, in which a piezoelectric film 14 is sandwiched by an electrode 13 and a reflective layer 12 bonded to a holder substrate 11.

Contrary to the conventional one, the shape of the holder substrate 11 is unlimited and the substrate is chosen from relatively lower acoustic impedance material such as PMMA, epoxy resin, bakelite, ABS, glass, nylon or rubber. The use of this substrate is not essential in the present invention, and, in the special case, the substrate can be omitted.

In the case of the illustrated embodiment, the reflective layer 12 functions as an electrode also. However, a separate electrode may be attached to the reflective layer 12. In either case, an electric signal is applied to the piezoelectric film 14 via the electrodes in order to generate ultrasonic waves. The reflective layer 12 is made of high acoustic impedance material such as Cu, Ag, Au, Cr, Al, brass, or ceramic. The thickness of the reflective layer 12 should be in a range from 1/32λ to 3/16λ, more specifically in the proximity of 1/16λ.

Any conventional piezoelectic material such as PVDF, copolymers of PVDF with tetrafluoroethylene, hexafluoropropylene or vinylidene chloride, blends of such polymers with PAN or PMA, and blends of such polymers with PZT are usable for the piezoelectric film 14. The material is not limited to polymer piezoelectrics only.

The electrode 13 is made of metal such as Cu, Al, Ag, Au and Cr. or metal oxides such as $I_nO_2$, and formed on one surface of the piezoelectric film 14 by means of evaporation, sputtering or plating. It also can be formed by covering with conductive paste or thin metal foil.

Figure 4:
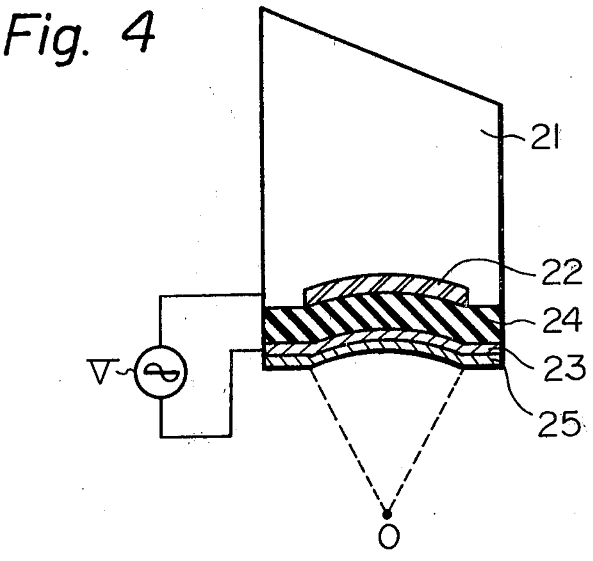
FIG. 4 is a side view, partly in section, of the other embodiment of the ultrasonic transducer in accordance with the present invention.

Another embodiment of the ultrasonic transducer in accordance with the present invention is shown in FIG. 4, in which a piezoelectric film 24 is sandwiched by a pair of electrodes 22 and 23. The one electrode 22 is bonded to a holder substrate 21 and the other electrode 23 is covered with a protector layer 25 which is made of polythylene, epoxy resin, nylon or polypropylene, and attached to the electrode 23 by means of film bonding or surface coating. In the case of this embodiment, the integrated components are all concave outward for better focusing of radiated ultrasonic waves on the point o as shown with dotted lines.

EXAMPLES

Example 1

A PVDF film of 76 μm thickness was used for the piezoelectric film and an Al electrode of about 1 μm thickness was evaporated on its one surface. A Cu reflective layer was used as an electrode also and PMMA was used for the holder substrate. The thickness of the reflective layer was 160 μm for the conventional ultrasonic transducer, and 40 μm for the ultrasonic transducer in accordance with the present invention. Using water as the transmission medium for the ultrasonic waves, the samples were both subjected to evaluation of frequency characteristics. The result is shown in FIG. 5.

For PVDF, the dielectric loss $\phi=\tan\delta_e$ is 0.25 and the mechanical loss $\psi=\tan\delta_m$ is 0.1. The electromechanical coupling factor $k_{33}{}^t$ is 0.19, the sound velocity $v_t$ is 2260 m/sec, and the density $\rho$ is $1.78\times10^3$ kg/$m^3$.

Figure 5:
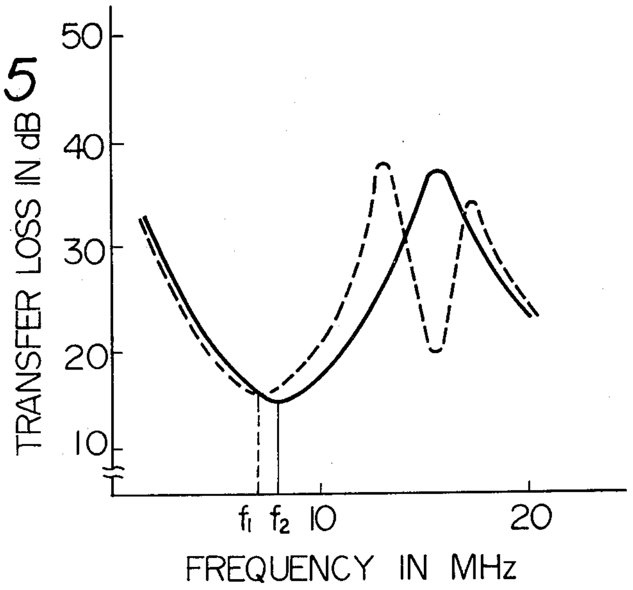
FIGS. 5 and 6 are graphs showing the relation between the transfer loss and the frequency of the sound wave.

In FIG. 5, frequency in $MH_z$ is taken on the abscissa whereas transfer loss in dB is taken on the ordinate, where the transfer loss is defined after the reference E. K. Sitting, *IEEE Transaction on Sonics and Ultrasonics,* Vol. SW-18, No.14, P 231-234 (1971). The solid line curve is for the transducer of 40 μm thickness reflective layer (present invention) and the dotted line curve is for the transducer of 160 μm thickness reflective layer (conventional art).

The curve for the present invention has its lowest point at a frequency $f_n=f_2$ and the curve for the prior art at a frequency $f_n=f_1$. As is apparent, the minimum value of transfer loss at $f_2$ is smaller than that at $f_1$. The 3 dB-bandwidth, Δf, for the present invention is evidently broader than that for the conventional art.

This outcome clearly indicates that the present invention assures reduced transfer loss at the minimum-loss frequency ($f_n$) together with broader frequency-band. Here, the difference in minimum-loss frequency is very minor and, consequently, it is quite easily feasible to obtain minimum transmission loss, i.e. maximum transmission efficiency, at any desired frequency by means of judiciously adjusting the thickness of the piezoelectric film, e.g. the PVDF film.

Example 2

Figure 6:
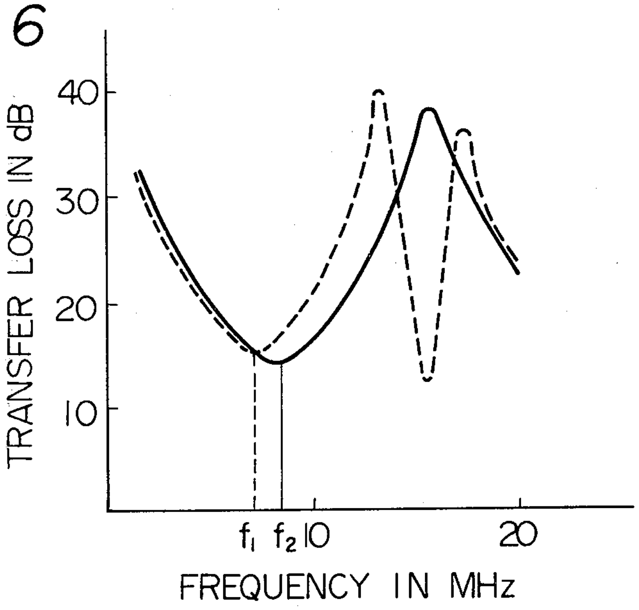

Just as in the foregoing Example, a PVDF film of 76 $\mu$m thickness was used for the piezoelectric layer, in which dielectric loss $\phi$ is 0.25, the mechanical loss $\psi$ is 0.1, the electromechanical coupling factor $k_{33}^t$ is 0.19, the sound velocity $v_t$ is 2260 m/sec, and the density $\rho$ is $1.78\times10^3$ kg/m$^3$. An Al electrode of about 1 $\mu$m was formed on one surface of the PVDF film by means of evaporation. A Cu reflective layer was used as an electrode also. Air was used as a substitute for the PMMA holder substrate used in the foregoing Example and water was used as the transmission medium for the ultrasonic waves. The thickness of the reflection layer was 40 $\mu$m for the transducer of the present invention and 160 $\mu$m for that of the conventional art. The samples were both subjected to evaluation of frequency characteristics. The result is shown in FIG. 6, in which frequency in $MH_z$ is taken on the abscissa and transfer loss in dB on the ordinate just as in FIG. 5.

The solid line curve is for the present invention and the dotted line curve for the conventional art. It is clear from this outcome that the present invention assures higher transfer efficiency and broader frequency-band. Like the foregoing Example, difference in minimum-loss frequency can be minimized by suitable adjustment in thickness of the PVDF film.

Example 3

The PVDF film coated with Al and used in Examples 1 and 2 was used in this Example also. A Cu reflective layer was used as an electrode also and its thickness was changed from 0 to 340 $\mu$m. When the thickness of the Cu reflective layer was 0, both surfaces of the PVDF film were coated with Al by means of evaporation. The holder substrate was made of PMMA and water was used as the transmission medium for the ultrasonic waves. The samples were subjected to evaluation of frequency characteristics and the result is shown in FIG. 7.

Figure 7:
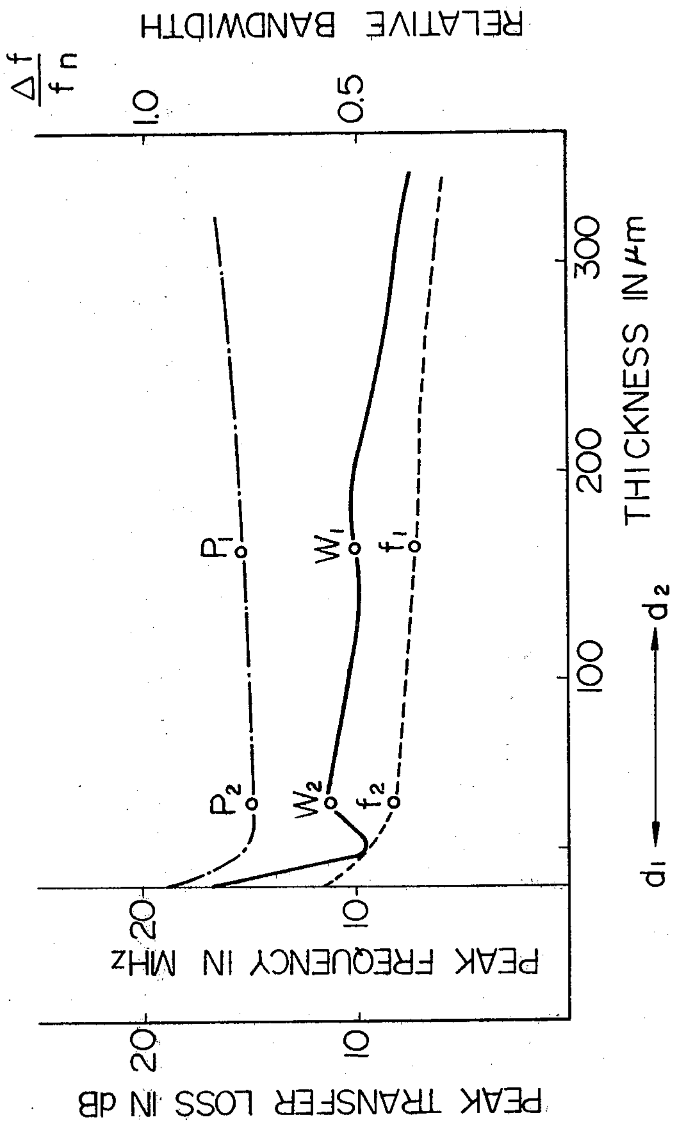
FIG. 7 is a graph showing the dependencies of the peak value of transfer loss, the width of frequency-band, the peak resonant frequency on the thickness of the reflective layer.

In FIG. 7, the thickness in $\mu$m of the Cu reflective layer is taken on the abscissa, and the minimum value in dB of transfer loss, the relative bandwidth, and the minimum-loss frequency in $MH_z$ are taken on the ordinates, respectively. The chain-and-dot line curve is for the peak value of transfer loss, the solid line curve for the relative bandwith, $\Delta_f/f_n$, and the dotted line curve for the minimum-loss frequency.

Values for the conventional art are marked with $P_1$, $W_1$ and $f_1$, respectively. The range on the abscissa between points $d_1$ (20 $\mu$m) and $d_2$ (120 $\mu$m) corresponds to the scope of the present invention. Values for the present invention in Example 1 are marked with $P_2$, $W_2$ and $f_2$, respectively.

This outcome clearly indicates that the present invention (the range between the points $d_1$ and $d_2$) assures higher transfer efficiency ($P_2$) and broader frequency-band ($W_2$) than the conventional art ($P_1$, $W_1$).

As is clear from the foregoing description, the thickness of the reflective layer is reduced to an extent of $\frac{1}{8}$ to $\frac{3}{4}$, more specifically about $\frac{1}{4}$, of the conventional one in accordance with the present invention.

This remarkable reduction in thickness of the reflective layer assures production of an ultrasonic transducer with high transfer efficiency and broad available frequency-band. The reduced thickness retains the advantage of the polymer piezoelectric material such as high flexibility and easiness in processing. The reduced thickness also allows application of etching technique or other fine treatments. Use of such a thin reflective layer minimizes ill influence on the functional characteristics of the ultrasonic transducer which may otherwise be caused by change in material for the holder substrate.

Although the foregoing description is focused upon use of a polymeric piezoelectric film, any different type of piezoelectric materials of low acoustic impedance is usable for the transducer in accordance with the present invention.

What is claimed is:

1. An improved ultrasonic transducer, comprising: a piezoelectric film with associated electrodes and a reflective layer bonded to the said piezoelectric element,
said reflective layer having a thickness in a range from 1/32 $\lambda$ to 3/16 $\lambda$,
and said $\lambda$ being the wavelength of sound waves within said reflective layer at one half of free resonant frequency of the said piezoelectric film.

2. An improved ultrasonic transducer as claimed in claim 1, in which
said reflective layer is backed with a holder substrate and the acoustic impedance of said substrate is lower than that of said reflective layer.

3. An improved ultrasonic transducer as claimed in claim 1 or 2, in which
said piezoelectric element comprises a polymer film.

4. An improved ultrasonic transducer as claimed in claim 3 in which
said polymer film is made of a material chosen from the group consisting of: PVDF; copolymers of vinylidene fluoride with tetrafluoethylene, trifluoroethylene, hexafluoropropylene, or vinylidene chloride; blends of said polymers with polyacrylonitride or polymethyl acrylate; and blends of said polymers with PZT or other ferroelectric ceramics powder.

5. An improved ultrasonic transducer as claimed in claim 1 or 2, in which
said reflective layer has an acoustic impedance larger than that of said piezoelectric element.

6. An improved ultrasonic transducer as claimed in claim 1 or 2, in which
said reflective layer is made of metal and functions as one of said electrodes.

7. An improved ultrasonic transducer as claimed in claim 6, in which
said metal is chosen from the group consisting of Cu, Ag, Au, Cr, Ni, Al, Sn, Pb, W, and alloys whose constituents include at least one of said metals.

8. An improved ultrasonic transducer as claimed in claim 2, in which
said holder substrate is made of polymer material.

9. An improved ultrasonic transducer as claimed in claim 1 or 2, in which
said piezoelectric element and said reflective layer are both concave outward.

10. An improved ultrasonic transducer as claimed in claim 6, in which said improved transducer is a multi-element transducer, and in which said reflective layer is divided into plural elements, each of which acts as the corresponding electrode on the piezoelectric element of a respective, corresponding element of said multi element transducer.

11. An improved ultrasonic transducer as claimed in claim 2, in which
one of said electrodes remote from said holder substrate is covered with a protective layer made of a polymeric material.

* * * * *